United States Patent [19]

Hulsing, II et al.

[11] Patent Number: 4,929,860
[45] Date of Patent: May 29, 1990

[54] ELECTRODE CONFIGURATION FOR VIBRATING BEAM TRANSDUCERS

[75] Inventors: Rand H. Hulsing, II, Redmond; Mitchell Novack, Kirkland, both of Wash.

[73] Assignee: Sundstrand Data Control, Inc., Redmond, Wash.

[21] Appl. No.: 194,806

[22] Filed: May 17, 1988

[51] Int. Cl.$^5$ .......................................... H01L 41/08
[52] U.S. Cl. .................................. 310/366; 310/321; 310/365; 310/368; 310/370
[58] Field of Search .............. 310/365, 366, 367–369, 310/370, 321

[56] References Cited

U.S. PATENT DOCUMENTS

| | | | |
|---|---|---|---|
| 2,271,870 | 2/1942 | Mason | 310/366 X |
| 2,277,709 | 3/1942 | McSkimin et al. | 310/366 X |
| 2,292,886 | 8/1942 | Mason | 310/366 X |
| 3,355,603 | 11/1967 | Hesse et al. | 310/366 |
| 4,215,570 | 8/1980 | Eer Nisse | 310/338 X |
| 4,356,425 | 10/1982 | Kogure et al. | 310/366 X |
| 4,370,584 | 1/1983 | Ikeno et al. | 310/365 |
| 4,377,765 | 3/1983 | Kogure et al. | 310/366 X |
| 4,469,979 | 9/1984 | Chuang | 310/370 |
| 4,656,383 | 4/1987 | Albert | 310/321 |
| 4,658,175 | 4/1987 | Albert | 310/323 |

FOREIGN PATENT DOCUMENTS

| | | | |
|---|---|---|---|
| 0070789 | 6/1978 | Japan | 310/370 |
| 0063108 | 4/1986 | Japan | 310/370 |

Primary Examiner—Mark O. Budd
Attorney, Agent, or Firm—Michael S. Yatsko; Trevor B. Joike

[57] ABSTRACT

A technique is described for tailoring the configuration of electrodes on a piezoelectric beam such that the tendency of the beam to vibrate in a predetermined flexure mode is enhanced. The mode has a predetermined longitudinal strain versus longitudinal position profile. At least two electrodes are mounted on the beam, and the configuration of at least one electrode varies as a function of longitudinal position, such that when a voltage difference is applied between the electrodes, the longitudinal force produced by the electrodes, as a function of longitudinal position, approximates the longitudinal strain versus longitudinal position profile. The configuration may be varied by varying the width of the electrode or the position of the electrode on the underlying beam surface.

11 Claims, 3 Drawing Sheets

ELECTRODE CONFIGURATION FOR VIBRATING BEAM TRANSDUCERS

FIELD OF THE INVENTION

This invention relates to vibrating beam transducers, of the type used in accelerometers and other force sensors.

BACKGROUND OF THE INVENTION

Piezoelectric vibrating beam transducers, frequently found in modern acceleration, force and pressure sensors, are driven into oscillation by internal strains created by voltages applied to electrodes located on the beams. In general, it is desirable for a beam to oscillate only in the single mode for which the beam and the associated transducer are designed. Oscillation in other modes dissipates energy into the support structure, and thereby decreases the oscillator efficiency. Additionally, this lost energy can affect the operation of other transducers mounted on the same structure (crosstalk), or excite resonances in the support structure that affect normal transducer operation.

The material of choice for most modern vibrating beam transducers is crystalline quartz. In this material, the electrodes create electric fields that are normal to the longitudinal axis of the quarts beam, and the electric fields cause forces directed along the longitudinal axis. These longitudinal forces are arranged such that they cause the beam to vibrate parallel to the electric field.

One technique for causing such a quartz beam to oscillate only in a predetermined mode is described in U.S. Pat. No. 4,469,979. The technique set forth therein is based upon a determination that when a quartz beam is vibrating, for example in its fundamental flexure mode, the strain in the beam is in one direction near the ends of the beam, is in the opposite direction near the center of the beam, and passes through zero (i.e., changes direction) at relative positions of approximately $Y/L=0.22$ and $0.78$, where L is the beam length and Y is longitudinal position along the beam. The technique used in the above-mentioned patent is reverse the electrode polarity at the crossover points of 0.22 and 0.78, to thereby increase the likelihood that the beam will vibrate only in its fundamental flexure mode.

SUMMARY OF THE INVENTION

The present invention provides a technique for tailoring the configuration of electrodes on a piezoelectric beam such that the tendency of the beam to vibrate in a predetermined flexure mode is enhanced. In the context of the present invention, the term "configuration" refers to the width and/or location of the electrodes as a function of longitudinal position along the beam.

In a preferred embodiment, the present invention provides an improvement for a transducer that comprises a piezoelectric beam having a longitudinal axis, and at least two electrodes mounted by the beam for causing the beam to vibrate in a predetermined flexure mode by producing forces directed along the longitudinal axis. The mode has a predetermined longitudinal strain versus longitudinal position profile. The improvement of the invention comprises varying the configuration of at least one of the electrodes as a function of longitudinal position, such that when a voltage difference is applied between the electrodes, the longitudinal force produced by the electrodes, as a function of longitudinal position, approximates the longitudinal strain versus longitudinal position profile.

A preferred embodiment of the invention is provided for use with a rectangular, clamped-clamped beam that is to be vibrated in its fundamental flexure mode. In this case, the predetermined longitudinal strain versus longitudinal position profile is in a first direction at each end of the beam, in an opposite direction at the midpoint of the beam, and passes through zero at crossover points between the midpoint and each end. The crossover points may be used to conceptually divide the beam into first and second end sections and a center section. In a preferred arrangement, within each section, two electrically connected first electrodes are positioned on a respective first pair of opposite surfaces of the beam, and two electrically connected second electrodes are positioned on a respective second pair of opposite surfaces of the beam. Within at least a portion of each section, the first electrodes have a constant width as a function of longitudinal position, while the second electrodes have varying widths as a function of longitudinal position. At the crossover points, a preferred arrangement is one in which one of the first and one of the second electrodes are positioned on a first surface, and the other first and the other second electrode are positioned on the opposite surface.

DETAILED DESCRIPTION OF THE INVENTION

Figure 1:
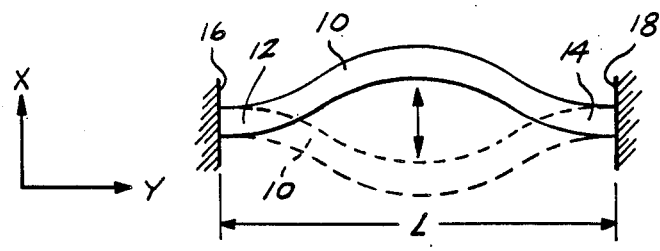
FIG. 1 schematically illustrates the fundamental flexure mode of vibration of a clamped-clamped beam.

The present invention is applicable to any piezoelectric beam that is to be vibrated in a predetermined flexure mode by means of electrodes attached to the beam. The invention will be illustrated by describing a beam that is to be vibrated in its fundamental flexure mode with both ends clamped. Such a vibration mode is illustrated in an exaggerated, schematic manner in FIG. 1, wherein beam 10 has ends 12 and 14 that are attached to respective support structures 16 and 18. The crystallographic axes of the material forming beam 10 are oriented as indicated, with the Y axis lying along the longitudinal beam axis, and the X axis lying along the direction of vibration. To cause beam 10 to vibrate, electrodes on the beam (not shown in FIG. 1) are connected to a drive circuit, and the drive circuit applies voltages to the electrodes such that electric fields in the X direction are created within the beam. The electric fields result in forces along the Y direction that cause beam 10 to vibrate at one of the natural frequencies of the beam, as described in greater detail below. As tension or compression forces are exerted along the longitudinal axis of beam 10, this natural frequency shifts, and this shift is the basis for the use of beam 10 as a force-to-frequency transducer in accelerometers and other sensors.

Figure 2:
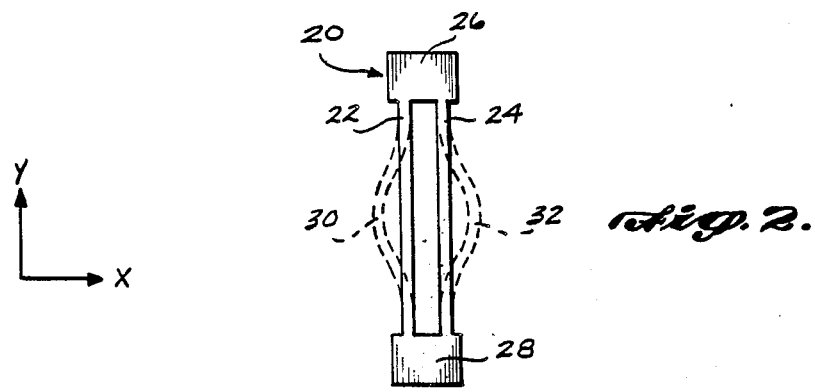
FIG. 2 illustrates the fundamental flexure mode of vibration of a doublended tuning fork transducer.

One common application of vibrating piezoelectric beams is in the double-ended tuning fork transducer shown in FIG. 2. Transducer 20 includes two beams 22 and 24, each of which is similar to beam 10 shown in FIG. 1. Beams 22 and 24 are secured to mounting pads 6 and 28, and are caused to vibrate in their fundamental flexure modes, 180° out of phase with one another, as indicated in exaggerated form by phantom lines 30 and 32. Mounting pads 26 and 28 provide sufficient coupling between the beams so that the beams vibrate at the same frequency. However, because the beams are vibrating 180° out of phase with one another, strains coupled into mounting pads 26 and 28 tend to cancel, thereby reducing the dissipation of energy into the surrounding support structure.

Figure 3:
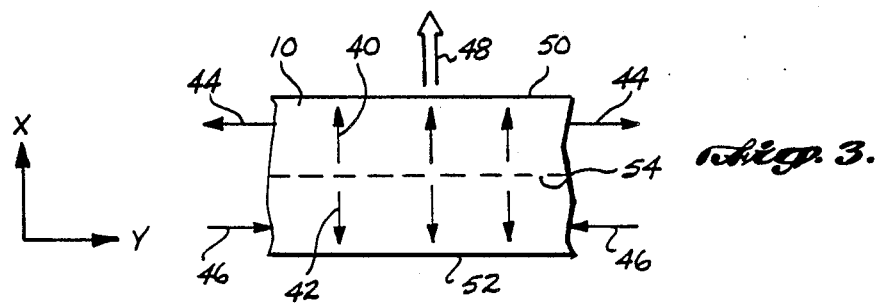
FIG. 3 illustrates the production of bending moments by means of oppositely directed electric fields within the beam.

The technique for causing a beam to vibrate laterally in response to longitudinal forces is schematically illustrated in FIG. 3. By suitable placement and polarization of the electrodes attached to the beam 10, an electric field is created that points in one direction along one side of the beam, for example in the upward direction indicated by arrows 40, while an electric field in the opposite direction is produced in the other side of the beam, as indicated by arrows 42. The result is a longitudinal tension force in the upper beam portion, indicated by arrows 44, and a longitudinal compression force in the lower beam portion, indicated by arrows 46. As a result of these forces, there is a net strain that bows the beam outward, in the direction indicated by arrow 48. Reversing the polarities of the electrodes would cause the electric field vectors to point inward toward one another, resulting in bowing of the beam in the opposite direction.

Figure 4:
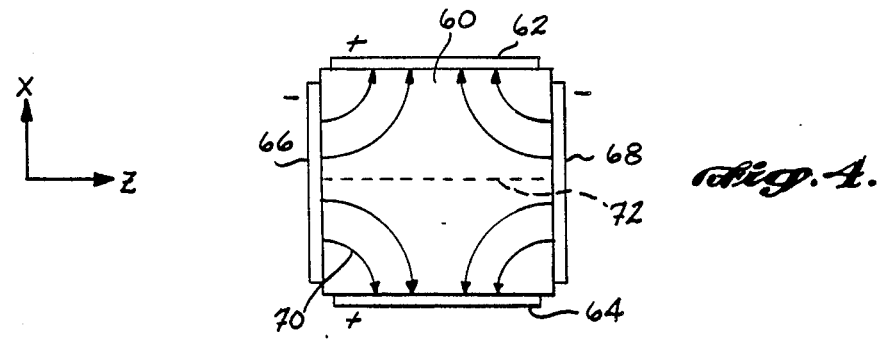
FIG. 4 illustrates a cross section of the beam shown in FIG. 3.

Theoretically, the electric field distribution shown in FIG. 3 could be produced by positioning a pair of interconnected electrodes on beam surfaces 50 and 52, and by embedding a second electrode within the beam along beam centerline 54. However, the production of an embedded electrode is impractical, given present manufacturing techniques. A suitable electric field distribution is therefore commonly produced by a technique such as that shown in FIG. 4. FIG. 4 illustrates a cross section of beam 60 that includes a first pair of electrodes 62 and 64 on its upper and lower surfaces, and a second pair of electrodes 66 and 68 on its side surfaces. Electrodes 62 and 64 are connected to one another and to one terminal to a drive circuit, while electrodes 66 and 68 are connected to one another and to the other terminal of the drive circuit. Electric field lines 70 are produced when electrodes 60 and 62 are positive and electrodes 66 and 68 are negative. These electric field lines include components along the X axis, directed away from beam centerline 72, and these components cause the beam to vibrate, as described above in connection with FIG. 3. Only electric field directed along the X axis will cause longitudinal (non-shear) forces of the type illustrated, and electric field components along the Z axis therefore do not contribute to the illustrated flexure mode vibration.

Figure 5:
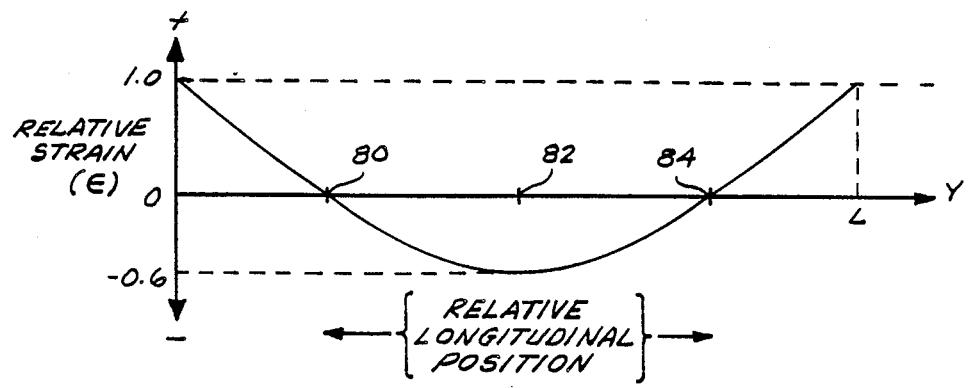
FIG. 5 illustrates the relative strain versus relative longitudinal position of a beam vibrating in its fundamental flexure mode.

It has been determined that for a beam vibrating in its fundamental flexure mode, the strain along the length of the beam has the form illustrated in FIG. 5. Analytically, the illustrated strain curve has the following form:

$$E = \frac{1}{2}\left[\cosh\left(\frac{\lambda Y}{L}\right) + \cos\left(\frac{\lambda Y}{L}\right)\right] - .4912511\left[\sinh\left(\frac{\lambda Y}{L}\right) + \sin\left(\frac{\lambda Y}{L}\right)\right] \quad (1)$$

where $\lambda = 4.730040784$, L is the length of the beam, and Y is the relative longitudinal position with respect to one end of the beam, i.e., Y ranges from 0 to L. The strain has a maximum (relative) value of 1.0 at the beam ends, at longitudinal positions 0 and L, L being the beam length. Moving along the length of the beam from position $Y = 0$, the strain continuously decreases until it reaches 0 at crossover point 80. The strain then increases in the opposite direction until it reaches a minimum relative value of approximately $-0.6$ at midpoint 82 of the beam. The strain is symmetrical about midpoint 82, and increases from its minimum value back to the maximum value of 1.0 at $Y = L$, crossing through 0 at second crossover point 84. Crossover points 80 and 84 occur at relative positions (Y/L) of approximately 0.22 and 0.78, respectively.

The present invention provides techniques for tailoring the widths and positions of electrodes on a piezoelectric beam, as a function of longitudinal position along the beam, so that when the electrodes are charged, the longitudinal forces produced by the resulting electric field vary with longitudinal position in a manner that approximates a desired strain distribution. For example, if a beam is to be vibrated in its fundamental flexure mode, then the longitudinal force distribution would approximate the strain versus position profile shown in FIG. 5. To vibrate the beam in other modes, other known strain distributions would be approximated.

Figure 6:
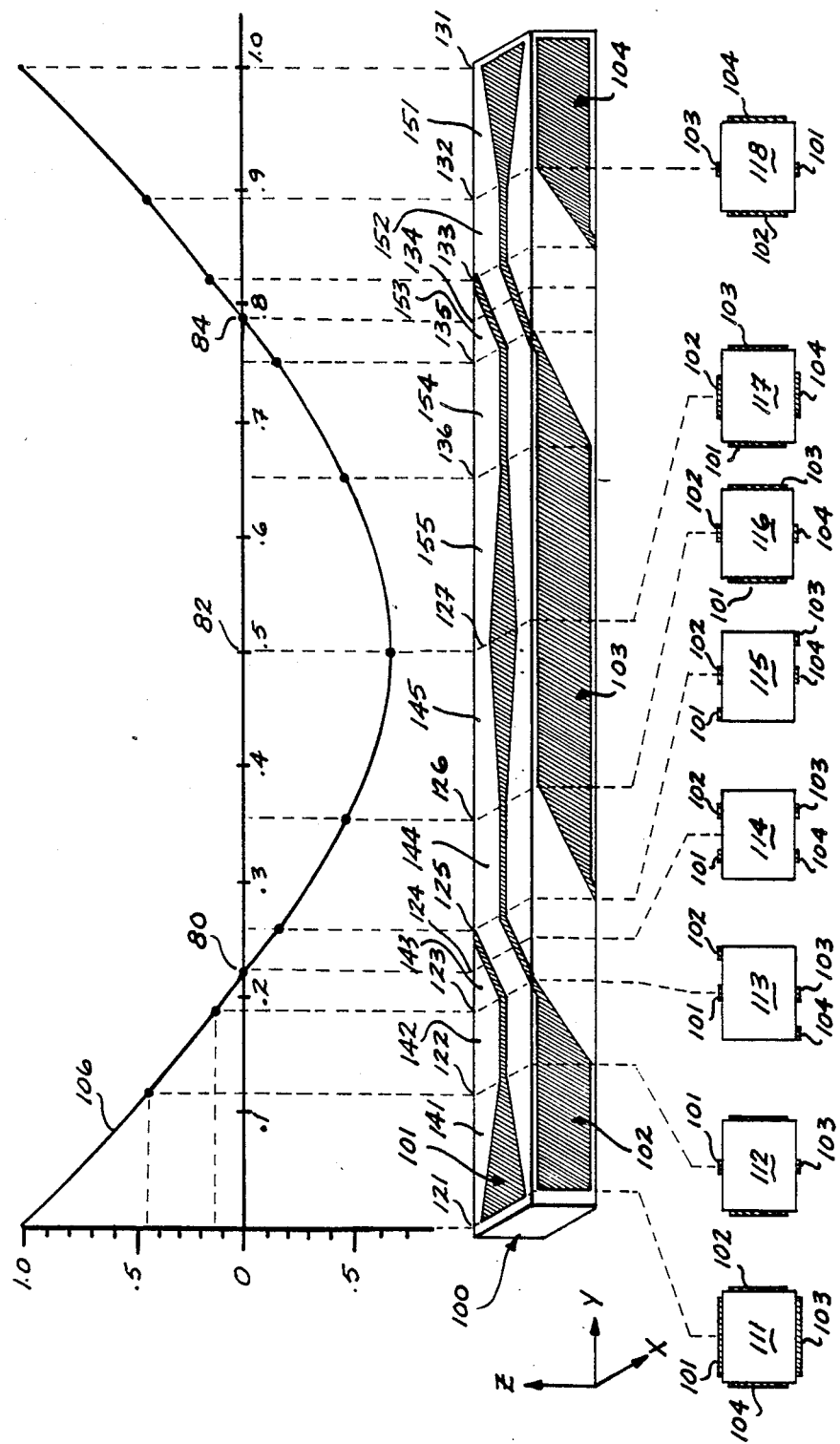
FIG. 6 illustrates a preferred electrode configuration according to the teachings of the present invention, illustrating the correspondence between the configuration and the strain versus position profile.

FIG. 6 illustrates a preferred embodiment of the invention in which both the widths and positions of electrodes are varied to produce the strain versus position profile of FIG. 5. In particular, FIG. 6 illustrates piezoelectric beam 100 having a generally rectangular cross section, and having electrodes 101-104 extending along the length of the beam. Electrodes 101 and 103 are connected to one another and to one terminal of a drive circuit, while electrodes 102 and 104 are connected to one another and to the other terminal of the drive circuit. The electrodes have a "barber pole" configuration in which each electrode travels halfway around the beam as it travels the length of the beam. FIG. 6 also includes beam cross-sectional views 111-118 that further illustrate the electrode configuration at various longitudinal positions along the beam. Finally, FIG. 6 includes graph 106 that reproduces the desired strain versus longitudinal position profile shown in FIG. 5. For purposes of description, a plurality of longitudinal positions 121-127 and 131-136 are indicated in FIG. 6, with views 111-117 corresponding to positions 121-127 respectively, and view 118 corresponding to position 132. Vertical dashed lines connect longitudinal positions 121-127 and 131-136 to corresponding positions on graph 106.

Figure 7:
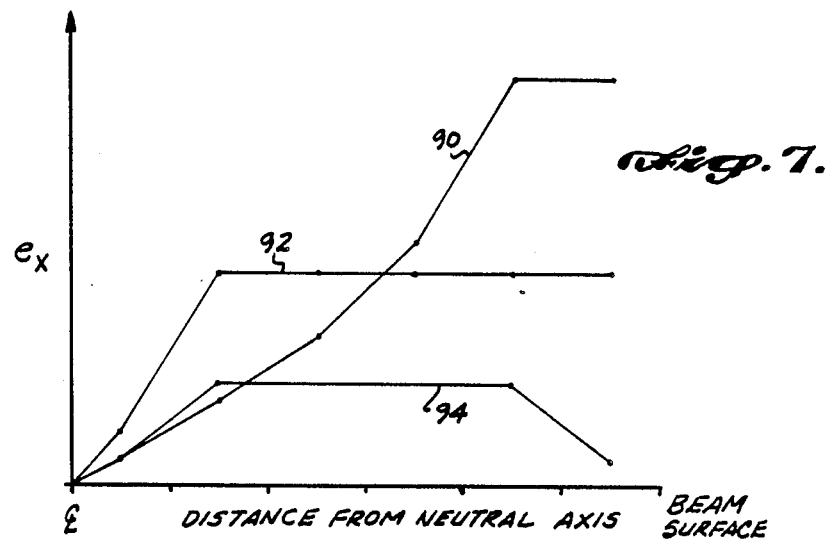
FIG. 7 is a graph illustrating the variation of the electric field within a piezoelectric beam.

At position 121 at one end of beam 100, all electrodes have widths approximately coextensive with their respective surfaces of the beam. In beam portion 141 that extends between positions 121 and 122, electrodes 101 and 103 decrease linearly in width, to produce the illustrated configuration at position 122. The relative strains produced by the electrode configurations shown at positions 121 and 122 can be estimated by straightforward computer modeling techniques. By way of example, referring to FIG. 7, graph 90 illustrates the X component of the electric field ($e_x$), in arbitrary units, as a function of the distance from the beam centerline, for the electrode configuration at position 121. Graph 92 shows the same results obtained for the electrode pattern at position 122. The net strains may then be calculated as follows:

$$S = \int x e_x dx \quad (2)$$

where the limits of integration are from the beam centerline to the beam surface. This calculation results in a value of 0.45 for the ratio of the strain at position 122 (derived form curve 92) to the strain at position 121 (derived from curve 90). Position 122 is therefore selected to lie at a longitudinal position at which the relative strain shown by graph 106 is equal to 0.45, this occurring at a relative longitudinal position of approximately 0.11.

In beam portion 142 beginning at position 122 and ending at position 123, electrode 102 gradually tapers, in an upward direction, until it reaches its minimum practical width, at which point it crosses onto the upper face of electrode 100 at position 123. Electrode 104 on the opposite face of beam 100 behaves in a similar manner, except that the taper is downward, such that at position 123, electrode 104 crosses onto the bottom surface of beam 100, as illustrated in view 113. The calculated field distribution for the electrode configuration at position 123 is shown by curve 94 of FIG. 7. The net bending moment calculated from curve 94 using equation (1) above produces a net relative strain of 0.12. Position 123 is therefore selected such that the corresponding point on graph 106 has a height (i.e., relative strain) of approximately 0.12.

In beam portion 143 between positions 123 and 125, all electrodes angle across their respective beam surfaces, at acute angles with respect to the longitudinal axis to produce the configuration shown in view 115 at position 125. From symmetry, it is clear that the net strains produced at positions 123 and 125 are equal but opposite. At position 124 midway between positions 123 and 125, the symmetrical configuration shown in cross section 114 is obtained. Since this configuration produces (approximately) 0 net strain, position 124 is selected to correspond to first crossover point 80 that has a relative longitudinal position of approximately 0.22. As a result, the illustrated electrode configuration produces a smoothly varying strain in the region of crossover 80.

Between positions 125 and 126, in beam portion 144, electrodes 102 and 104 do not vary in either width or position, while electrodes 101 and 103 cross onto the adjacent side surfaces of the beam (immediately past position 125) and then widen until they extend for the full height of their respective surfaces at position 126. This electrode configuration is identical to the configuration shown in view 112, with the electrodes rotated 90° about the longitudinal beam axis. The net strain at position 126 is equal to −0.45, and position 126 is located at the appropriate longitudinal position, based upon graph 106, to produce a relative strain of 0.45. Between positions 126 and 127, in electrode portion 145, electrodes 101 and 103 do not vary, while electrodes 102 and 104 widen to produce the configuration shown in cross section 117. Position 127 corresponds to midpoint 82 of the beam, and it is known that the relative strain at the midpoint is approximately equal to −0.6. Therefore the widths of electrodes 102 and 104 at position 127 are selected to produce a relative strain of such magnitude, i.e., the widths of the electrodes are less than the full width shown in cross section 111.

Beyond position 127, the electrode configuration proceeds to produce the same pattern, such that positions 131-136 correspond to positions 121-126, and beam portions 151-155 correspond to portions 141-145. However the electrodes continue to rotate in the same direction so that, for example, when position 132 is reached, the electrodes have again traveled one-quarter of a turn about the longitudinal beam axis, to produce the configuration shown in cross section 118. By comparing cross sections 112 and 118, it may be seen that each electrode has traveled one-half of a turn about the beam axis.

Figure 8:
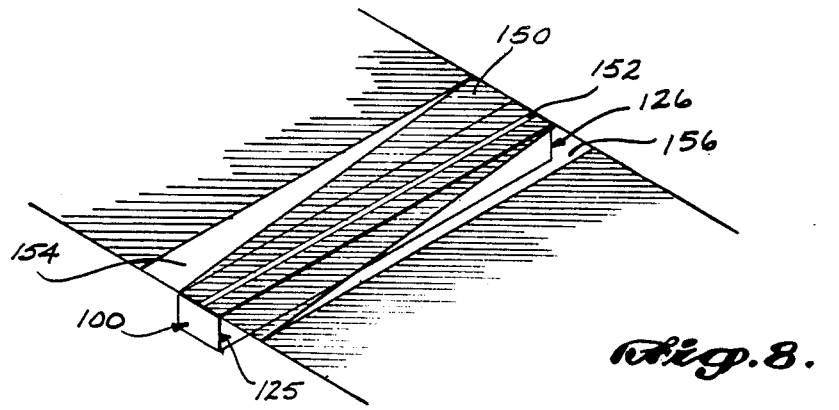
FIG. 8 is a schematic view illustrating a method of making portions of the electrode configuration shown in FIG. 6.

The electrode patterns shown in FIG. 6 may be produced by conventional masking techniques. For those portions of the beam in which the side surfaces of the beam include tapering electrodes, a shadow masking technique may be used. The production of electrodes for one of these portions, the section of the beam between positions 125 and 126, is illustrated in FIG. 8. In this technique, mask 150 is placed over beam 100, the mask including a central opening 152 having a constant width, and a pair of triangular cutouts 154 and 156 flanking the edge of the beam. By directing the gold or other electrode forming material at an appropriate angle with respect to the beam, triangular cutouts 154 and 156 will produce the tapering patterns illustrated in FIG. 6.

While the preferred embodiments of the invention have been illustrated and described, it will be understood that variations will be apparent to those skilled in the art. For example, exact reproduction of the strain distribution shown in FIG. 5 would require modification to the illustrated electrode patterns based upon exact analysis of the electric field distribution in the beam, and exact analysis of the beam's bending mode, since it is only approximately that of a clamped-clamped beam. Also, an additional force may be added to the illustrated strain curve, to account for air or gas damping. In a gas damping model, the beam behaves as a thin rod that displaces the air with approximately laminar flow. This means the damping loading is linear with velocity, which is a function of position from one end of the beam to the other. This force depends upon the mass loading of the air, and the gas pressure around the crystal.

The embodiments of the invention in which an exclusive property or privilege is claimed are defined as follows:

1. A transducer comprising a substantially solid piezoelectric beam having a natural resonant frequency and a longitudinal axis that extends between two opposed clamped ends; and a plurality of electrodes mounted by the beam for causing the beam to vibrate by producing forces directed along the longitudinal axis, at least one of the electrodes defining means for increasing the tendency of the beam to vibrate in a predetermined flexure mode at the natural resonant frequency, to the exclusion of harmonic frequencies, said means comprising a configuration of said at least one electrode that varies as a function of longitudinal position along the beam such that when a voltage difference is applied between the electrodes, the longitudinal force produced by the electrodes as a function of longitudinal position, approximates a longitudinal strain versus longitudinal position profile of the predetermined flexure mode at the natural resonant frequency.

2. The transducer of claim 1, wherein at least a portion of the beam has a rectangular cross section, wherein within said portion, two electrically connected first electrodes are positioned on a respective first pair of opposite surface of the beam, and two electrically connected second electrodes are positioned on a respective second pair of opposite surfaces of the beam, the width of at least one of the electrodes varying as a function of longitudinal position within said portion.

3. The transducer of claim 2, wherein within said portion, the first electrodes have a constant width, and the second electrodes vary in width.

4. The transducer of claim 2, wherein the profile includes at least one crossover point at which the longitudinal strain is zero, and wherein at the crossover point, one of the first and one of the second electrodes are positioned on the same surface of the beam, and the other first and other second electrodes are positioned on an opposite surface of the beam.

5. The transducer of claim 4, wherein in a region of the beam encompassing the crossover point, each electrode forms an acute angle with the longitudinal axis.

6. The transducer of claim 2, wherein each electrode circles the beam in a predetermined direction as the electrode extends along the longitudinal axis, the predetermined direction for each electrode being the same.

7. The transducer of claim 1, wherein the predetermined longitudinal strain versus longitudinal position profile is in a first direction at each end of the beam, in an opposite direction at the midpoint of the beam, and passes through 0 at crossover points between the midpoint and each end of the beam, the crossover points dividing the beam into first and second end sections and a center section, at least one electrode within each section having a varying configuration as a function of the longitudinal position.

8. The transducer of claim 7, wherein at least a portion of each end section, one of the electrodes has a constant width, and the other electrode decreases in width as the distance from the adjacent beam end increases.

9. The transducer of claim 7, wherein at each crossover point, both electrodes are positioned on the same surface of the beam.

10. The transducer of claim 9, wherein in a region surrounding each crossover point, all electrodes lie at an acute angle with respect to the longitudinal axis.

11. The transducer of claim 7, wherein each electrode circles the beam in a predetermined direction as the electrode extends along the longitudinal axis, the predetermined direction being the same for both electrodes.

* * * * *